United States Patent
Stahr

(10) Patent No.: US 10,643,949 B2
(45) Date of Patent: May 5, 2020

(54) COMPONENT CARRIER AND METHOD FOR MANUFACTURING THE SAME

(71) Applicant: AT&S Austria Technologie & Systemtechnik Aktiengesellschaft, Leoben (AT)

(72) Inventor: Hannes Stahr, St. Lorenzen im Mürztal (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/560,188

(22) Filed: Sep. 4, 2019

(65) Prior Publication Data

US 2019/0393155 A1    Dec. 26, 2019

Related U.S. Application Data

(63) Continuation of application No. 15/536,607, filed as application No. PCT/EP2015/079933 on Dec. 16, 2015, now Pat. No. 10,424,541.

(30) Foreign Application Priority Data

Dec. 16, 2014   (DE) .......................... 10 2014 118 788

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4803* (2013.01); *H01L 21/486* (2013.01);
(Continued)

(58) Field of Classification Search
CPC ............. H05K 1/14; H05K 1/141–144; H01L 21/568; H01L 21/5389; H01L 21/6835; H01L 23/538
(Continued)

(56) References Cited

U.S. PATENT DOCUMENTS 7,619,317 B2    11/2009   Lien et al.
7,742,314 B2 *   6/2010   Urashima ................ H01G 2/06
                                                     174/260
(Continued)

FOREIGN PATENT DOCUMENTS

CN            102244018 A       11/2011
DE      10 2012 112 758 A1     11/2013
(Continued)

*Primary Examiner* — Tuan T Dinh
(74) *Attorney, Agent, or Firm* — Robert A. Blaha; Smith Tempel Blaha LLC

(57) ABSTRACT

A component carrier including an electrically insulating core, at least one electronic component embedded in the core, and a coupling structure with at least one electrically conductive through-connection extending at least partially therethrough and having a component contacting end and a wiring contacting end. The electronic component directly contacts the component contacting end. The wiring contacting end is directly electrically contacted to the wiring structure. The exterior surface portion of the coupling structure has homogeneous ablation properties and surface recesses filled with an electrically conductive wiring structure. A method includes embedding an electronic component in an electrically insulating core, providing a coupling structure with a conductive connection having a component end and a wiring end, connecting the electronic component directly to the component end, providing a surface portion of the coupling structure with homogeneous ablation properties, patterning the surface portion with recesses and filling
(Continued)

the recesses with a wiring structure such that the wiring end is contacted directly.

16 Claims, 5 Drawing Sheets

(51) Int. Cl.

| | | |
|---|---|---|
| *H01L 23/13* | (2006.01) | |
| *H01L 23/14* | (2006.01) | |
| *H01L 23/31* | (2006.01) | |
| *H01L 23/498* | (2006.01) | |
| *H01L 23/00* | (2006.01) | |
| *H05K 3/10* | (2006.01) | |
| *H05K 1/03* | (2006.01) | |
| *H05K 1/09* | (2006.01) | |
| *H05K 1/11* | (2006.01) | |
| *H05K 1/18* | (2006.01) | |
| *H05K 3/00* | (2006.01) | |
| *H05K 3/02* | (2006.01) | |
| *H05K 3/18* | (2006.01) | |

(52) U.S. Cl.
CPC ............ *H01L 23/13* (2013.01); *H01L 23/145* (2013.01); *H01L 23/3121* (2013.01); *H01L 23/49822* (2013.01); *H01L 23/49827* (2013.01); *H01L 23/49838* (2013.01); *H01L 24/08* (2013.01); *H01L 24/32* (2013.01); *H05K 3/107* (2013.01); *H01L 2224/08235* (2013.01); *H01L 2224/32225* (2013.01); *H05K 1/0366* (2013.01); *H05K 1/09* (2013.01); *H05K 1/115* (2013.01); *H05K 1/186* (2013.01); *H05K 3/0032* (2013.01); *H05K 3/027* (2013.01); *H05K 3/181* (2013.01); *H05K 3/188* (2013.01); *H05K 2201/0376* (2013.01); *H05K 2203/107* (2013.01); *H05K 2203/1469* (2013.01)

(58) Field of Classification Search
USPC .......... 361/760–766, 795, 803; 174/259–262
See application file for complete search history.

(56) References Cited

U.S. PATENT DOCUMENTS

| | | |
|---|---|---|
| 8,361,842 B2 | 1/2013 | Yu et al. |
| 2005/0045379 A1 | 3/2005 | Sakurai et al. |
| 2005/0253244 A1 | 11/2005 | Chang |
| 2006/0252248 A1 | 11/2006 | Hu |
| 2010/0002406 A1 | 1/2010 | Hsu |
| 2010/0236817 A1 | 9/2010 | Chen et al. |
| 2010/0317154 A1 | 12/2010 | Jobetto |
| 2011/0221069 A1 | 9/2011 | Kunimoto |
| 2012/0212919 A1* | 8/2012 | Mano ................ H05K 1/185 361/782 |
| 2013/0334683 A1* | 12/2013 | Kim ................ H01L 23/49827 257/737 |
| 2014/0252646 A1 | 9/2014 | Hung et al. |
| 2015/0060115 A1 | 3/2015 | Lee et al. |
| 2017/0025380 A1* | 1/2017 | Zhai ..................... H01L 24/19 |
| 2017/0339784 A1* | 11/2017 | Zluc ................... H05K 1/0366 |

FOREIGN PATENT DOCUMENTS

| | | |
|---|---|---|
| JP | 2003197822 A | 7/2003 |
| WO | 2011109648 A1 | 9/2011 |

* cited by examiner

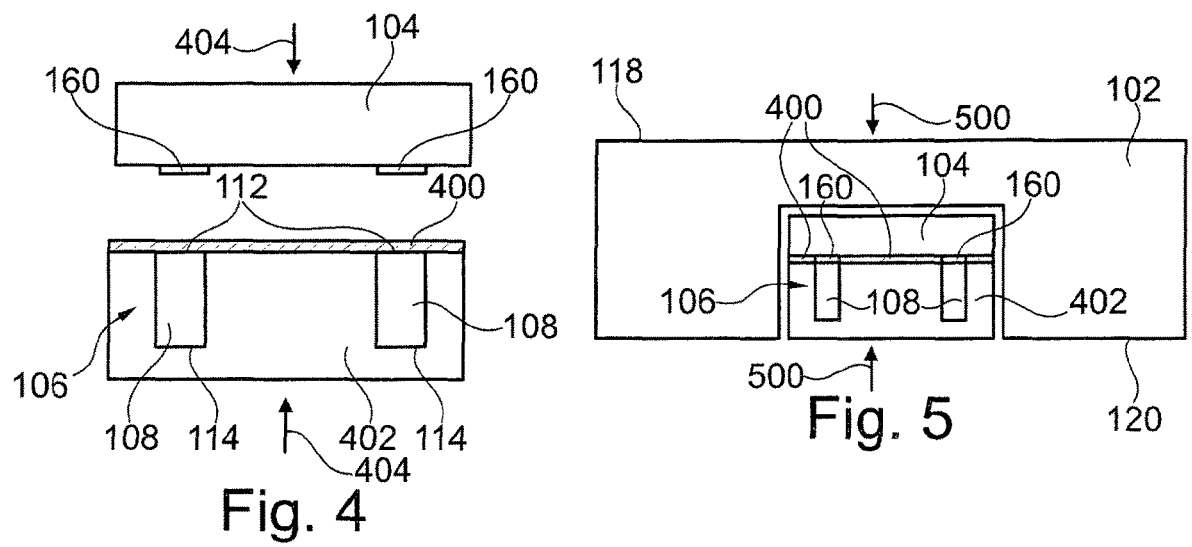
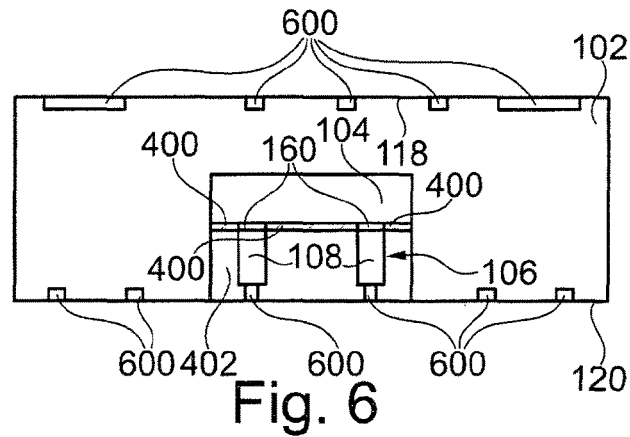
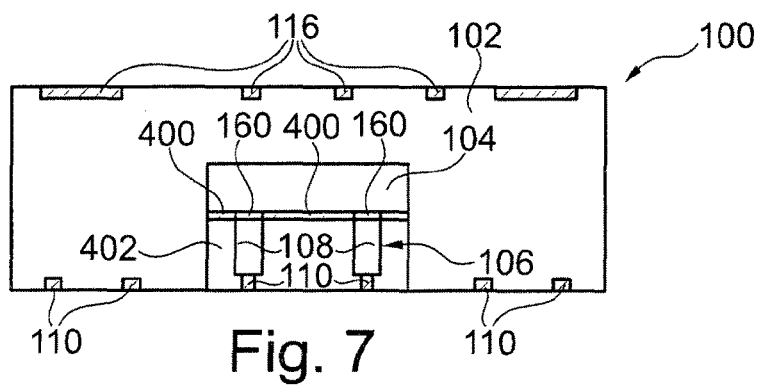

COMPONENT CARRIER AND METHOD FOR MANUFACTURING THE SAME

CROSS-REFERENCE TO RELATED APPLICATIONS

This application is a continuation of U.S. Ser. No. 15/536,607, which was a national phase application of international patent application PCT/EP2015/079933 filed on Dec. 16, 2015, which claimed the benefit of the filing date of German Patent Application No. 10 2014 118 788.1, filed on Dec. 16, 2014, the disclosures of which are hereby incorporated herein by reference in their entirety.

TECHNOLOGICAL FIELD

The invention relates to a component carrier, and to a method of manufacturing a component carrier.

TECHNOLOGICAL BACKGROUND

In the context of growing product functionalities of component carriers equipped with one or more embedded electronic components and increasing miniaturization of such electronic components as well as a rising number of electronic components to be mounted on an/or in component carriers such as printed circuit boards, increasingly more powerful array-like components or packages having several electronic components are being employed, which have a plurality of contacts or connections, with ever smaller spacing between these contacts. Contacting embedded electronic components as well as surface mounted electronic components therefore becomes more and more challenging. At the same time, component carriers shall be mechanically robust so as to be operable even under harsh conditions.

There may be a need to provide a component carrier with embedded electronic component which can be contacted in a simple and reliable way.

SUMMARY

According to an exemplary embodiment of the invention, a component carrier for carrying electronic components is provided, wherein the component carrier comprises an at least partially electrically insulating core, at least one electronic component embedded in the core, and a coupling structure with at least one electrically conductive through-connection extending at least partially therethrough and having a component contacting end and a wiring contacting end, wherein the at least one electronic component is electrically contacted directly (i.e. without further members in between) to the component contacting end, wherein at least an exterior surface portion of the coupling structure has homogeneous ablation properties and is patterned so as to have surface recesses filled with an electrically conductive wiring structure, and wherein the wiring contacting end is electrically contacted directly (i.e. without further members in between) to the wiring structure.

According to another exemplary embodiment of the invention, a method of manufacturing a component carrier for carrying electronic components is provided, wherein the method comprises embedding at least one electronic component in an at least partially electrically insulating core, providing a coupling structure with at least one electrically conductive through-connection extending at least partially therethrough and being formed with a component contacting end and a wiring contacting end, electrically contacting the at least one electronic component directly to the component contacting end, providing at least an exterior surface portion of the coupling structure with homogeneous ablation properties, patterning the exterior surface portion so as to form surface recesses, and filling the surface recesses with an electrically conductive wiring structure so that the wiring contacting end is electrically contacted directly to the wiring structure.

In the context of the present application, the term "coupling structure" may particularly denote a partially electrically insulating structure with one or more integrated electrically conductive through-connections. Such a coupling structure may be configured as a coupling body which may be provided separately from the at least partially electrically insulating core and may be a preformed or prefabricated member or intermediate structure serving for directly contacting pads (or other electric contacts) of the electronic component with regard to an exterior component carrying surface of the component carrier. In another embodiment, a coupling structure is formed by a coupling body of the above-mentioned type combined with a coupling layer also contributing to the electric coupling of the embedded electronic component.

In the context of the present application, the term "through-connection" may denote particularly an electrically conductive structure providing for an electric contact between a pad (or another electric contact) of the embedded electronic component and an exterior component carrying surface of the component carrier. A component carrying surface of the component carrier may be a surface which is adapted for surface mounting one or more electronic components such as semiconductor chips. Such a through connection may extend substantially or entirely perpendicular with regard to opposing main surfaces or component carrying surfaces of the component carrier.

In the context of the present application, the term "homogeneous ablation properties" of the exterior surface portion of the coupling structure may particularly denote that at least in this portion exposed to an environment the material composition is of such a kind that the surface material consists of one (in particular dielectric) material or of a combination of several dielectric and/or electrically conductive materials so that, when applying an ablation process to this surface portion, the material can be removable with a constant ablation rate. Such an ablation rate may be a parameter indicative of the amount of material removed per time for which the ablation procedure (in particular a laser ablation procedure or an etching ablation procedure) is active. For example, when laser ablation is applied, the application of the laser beam will result in the removal of material from the surface portion of the coupling structure with a homogeneous or constant ablation rate. Homogeneous ablation properties may for instance be achieved by forming the surface portion of a single material (such as pure resin) rather than forming it, for example, from a mixture of resin and glass fibers. In the latter example of resin and glass fibers, homogeneous ablation properties cannot be achieved, since the ablation rate of glass fibers is significantly smaller than the ablation rate of the resin material.

According to an exemplary embodiment of the invention, a highly advantageous contacting architecture for directly contacting one or more embedded electronic components is provided which is based on the direct attachment of a coupling structure with its component contacting end(s) on one or more pads (or other electric contacts) of the electronic component (such as a semiconductor chip). The through-connection(s) extend(s) preferably vertically through the coupling structure and serve(s) for accomplishing, as an electrically conductive bridge, an electric contact between the pad(s) of the electronic component and the wiring structure by contacting the wiring structure at the wiring contacting end. By forming the exposed surface portion of the coupling structure from a material with homogeneous ablation properties, a simple ablation process then allows to flexibly design any desired wiring structure as external wiring pattern in the surface portion of the circuit structure in a way to provide a contact to the (for instance still buried) wiring contacting end of the at least one through-connection. With this contacting architecture, it is possible to provide an ultrafine line wiring when interconnecting one or more embedded electronic components with an external surface of the component carrier (or with one or more further electronic components surface mounted on such an external surface of the component carrier). The one or more embedded electronic components may be contacted directly and without a cumbersome redistribution layer by the use of at least one through-connection contacted via an application specific ablation of the exterior surface portion of the coupling structure with homogeneous ablation properties. Such a component interconnecting technique allows for a landless or substantially landless interconnection of an electronic component to a patterned layer of a component carrier such as a printed circuit board. It may advantageously allow for an ultrafine lining with a grooving/plating process. Thereby, a novel type of first level interconnection of the electronic components may be accomplished.

In the following, further exemplary embodiments of the component carrier, and the method of manufacturing a component carrier will be explained.

In an embodiment, at least the exterior surface portion of the coupling structure is made of a material free of glass fibers. Therefore, the surface portion may be neither prepreg nor FR4 (both having glass fibers) which would deteriorate the desired homogeneous ablation properties of the coupling structure. By providing the exterior surface portion of the coupling structure, more particularly the entire electrically insulating material of the coupling structure, from a material free of glass fibers, a precise and small dimensioned definition of the wiring structure is guaranteed which is not disturbed by regions having poor, spatially varying or undefined ablation properties.

In an embodiment, at least the exterior surface portion of the coupling structure comprises at least one of the group consisting of a pure resin, a palladium doped resin, a copper oxide doped resin, and a photoresist. These materials are particularly preferred examples providing substantially homogeneous ablation properties and are nevertheless compatible with printed circuit board technology, being a preferred example for the component carrier. Moreover, when using materials such as a palladium doped resin or a copper oxide doped resin, electroless plating (as a starting procedure of the formation of the wiring structure) may be initiated selectively on these materials with high efficiency, so that the electroless plating of metallic material on other surface portions of the component carrier may be efficiently suppressed. This may advantageously render a polishing procedure unnecessary.

In an embodiment, the at least one through-connection comprises at least one pillar, in particular at least one circular cylindrical pillar and/or a plurality of pillars aligned parallel to one another. Such pillars may be electrically conductive posts extending through the coupling structure and providing for the contact between the electronic component and the wiring structure. They may particularly have a circular cross-section, or alternatively a polygonal (for instance rectangular) cross-section. By an arrangement of for instance matrix-like arranged pillars, a user is provided with a high degree of freedom of designing a desired wiring structure matching with the at least one embedded electronic component and being contacted in an application specific way via the pattern of pillars.

In an embodiment, an exterior surface of the wiring structure flushes with an exterior surface of the exterior surface portion of the coupling structure. Correspondingly, the wiring structure may be fully embedded within the surface portion of the coupling structure without protruding beyond the surface portion. In other words, the exterior surface portion of the wiring pattern and the exterior surface portion of the coupling structure may form a common planar surface without pronounced topology so that the wiring structure may even be structurally integrated into the exterior surface portion of the coupling structure without protruding therefrom. The wiring structure is therefore securely protected from damage during use.

In an embodiment, the component carrier comprises at least one further electrically conductive wiring structure on a main surface of the component carrier opposing another main surface thereof at which the exterior surface portion of the coupling structure and the wiring structure are located. Therefore, both opposing main surfaces of the component carrier may be configured in accordance with the wiring technology according to an exemplary embodiment of the invention in which the respective wiring structure is formed by ablating material from a corresponding surface portion with homogeneous ablation properties, followed by a filling of correspondingly formed recesses or grooves with electrically conductive material. Thus, the space saving and fine lined wiring architecture may be applied on both opposing main surfaces of the component carrier, or only on one.

In an embodiment, the component carrier comprises an adhesive structure (in particular of a cured or hardened adhesive) located at least partially between the coupling structure and the at least one electronic component embedded in the core. Correspondingly, the method may further comprise forming a soft adhesive structure between the at least one electronic component and the at least one component contact end at an exposed surface of the coupling structure, and connecting (in particular pressing) the at least one electronic component and the coupling structure together to thereby squeeze the soft adhesive away from a contact area (in particular from a protruding pad of the electronic component) between the component contact end and the at least one electronic component. The (cured or hardened) adhesive material of the readily manufactured component carrier between the coupling structure and the embedded electronic component may result from an advantageous manufacturing procedure in which, before embedding the electronic component in the core, the electronic component is adhered to a component carrying surface of the coupling structure by adhesive material. The adhesive material may be applied as a layer of soft adhesive material between coupling structure and electronic component so that, after pressing the electronic component and the coupling structure to one another, the adhesive material will be squeezed away from the slightly protruding contacts or pads of the electronic component. Thereby, a proper electronic coupling between electronic component and the at least one through-connection is ensured while also providing for a robust mechanical connection between coupling structure and the electronic component to be embedded.

In an embodiment, at least one of the wiring structure, and the at least one through-connection comprises or consists of at least one of the group consisting of copper, aluminum, and nickel. In particular copper is preferred, since it is completely compatible with printed circuit board technology, according to which the component carrier is manufactured in accordance with a preferred embodiment. Using only a single metal provides for a simple manufacturability while simultaneously preventing problems with different electrically conductive materials such as contact resistance effects, different thermal expansion, etc.

In an embodiment, dielectric material of the coupling structure comprises a matrix and filler particles embedded in the matrix, wherein the material of the matrix and of the filler particles have homogeneous ablation properties. The use of filler particles has the advantage that the properties of the coupling structure may be precisely controlled. For example, such filler particles may influence the thermal conductivity of the material of the coupling structure, the ablation capability, the capability of depositing in particular electrically conductive material thereon, etc.

In an embodiment, the filler particles are selected from a group consisting of beads (such as spheres, like glass spheres), and organic fibres. In contrast to glass fibers, sufficiently small dimensioned glass spheres or beads of other shape do not significantly change the ablation properties compared to the matrix material (such as a resin), but nevertheless allow to improve the structural integrity of the component carrier. Also organic fibers may be designed to have substantially the same ablation properties as the matrix.

In an embodiment, a lateral extension (such as a width) of traces of the wiring structure is narrower than a lateral extension (such as a diameter) of the at least one through-connection. Since the width of the wiring structure can be defined by an ablation procedure such as mechanical drilling or laser ablation, its dimension can be rendered very small. Therefore, the through-connections in this case serve as an adaptation structure for adapting dimensions of the wiring structure to dimensions of a pad of the electronic device. The connection technology according to an exemplary embodiment of the invention is hence compatible with very small dimensioned wiring structures.

In an embodiment, a lateral extension (such as a width) of traces of the wiring structure is broader than a lateral extension (such as a diameter) of the at least one through-connection. In this alternative embodiment, the dimensions of the wiring pattern may be laterally even larger than those of the through-connections. This can be advantageous in an embodiment, in which components mounted on an exterior main surface of the component carrier require a relatively large dimensioned wiring structure.

In an embodiment, the at least one through-connection has a cylindrical shape with an aspect ratio of larger than 1. In particular, the aspect ratio, i.e. a ratio between length in vertical direction and diameter in horizontal direction, of the through-connections may be larger than 1.5 or even larger than 2. Therefore, even electronic components buried or embedded deeply within an interior of the component carrier may be precisely connected via the through-connections.

In an embodiment, the method comprises connecting the at least one electronic component to the coupling structure prior to embedding the at least one electronic component in the core. Thus, the coupling structure may be firstly connected electrically and mechanically to the electronic component to be embedded, before an integral arrangement of coupling structure and electronic component may then be inserted into a correspondingly shaped recess of the core for completing the embedding. Thus, the effort for contacting the embedded electronic component can be kept small with this technology.

In an embodiment, the method further comprises forming the surface recesses (for defining the wiring structure) by laser drilling. Laser drilling is considered as particularly appropriate for forming any desired wiring structure, which can be easily adapted to a specific application, by simply defining a trajectory along which a laser beam operates on the exposed surface portion of the coupling structure having homogeneous ablation properties. Two opposing main surfaces of the component carrier can be processed simultaneously or sequentially by such a laser ablation treatment.

In another embodiment, the method comprises forming the surface recesses (for defining the wiring structure) by etching, in particular by photolithographic etching and/or followed by a second step using reactive ion etching (RIE). According to such an architecture, surface material may be patterned by etching in order to define the wiring pattern.

As a further alternative, the wiring pattern in the exposed surface portion having homogeneous ablation properties may be performed in another way, for instance by mechanical drilling or by embossing.

In an embodiment, the method further comprises forming at least one accommodation volume (such as a blind hole) within the core, accommodating the at least one electronic component (and optionally at least part of the contact structure) in the at least one accommodation volume, and connecting the core with the at least one electronic component (for instance by pressing, alternatively by adhering). Such an accommodation volume may be formed by etching or punching foils of prepreg material or the like, wherein thereafter one or more of such pre-treated foils may be used for embedding electronic components in corresponding accommodation volumes.

In an embodiment, an interface (i.e. a connection region) between the at least one electronic component and the at least one through-connection is free of a redistribution layer (RDL). Therefore, by not providing a redistribution layer between electronic component and coupling structure, a simple connection with a compact design is rendered possible. It may be advantageous when, as shown in FIG. 4, the copper pillars and the dielectric (see reference numeral 106) end at the same level. This can be done in a simple way: After copper pillar bumping of the wafer level, the wafer may be coated with a dielectric and mechanical grinded to expose the pillars. This flat component is in direct contact to the dielectric for laser grooving.

In an embodiment, the at least one electronic component and at least part of the coupling structure are integrally formed, in particular are integrally formed in a semiconductor substrate (such as a silicon wafer). Correspondingly, the method may further comprise providing the at least one electronic component and at least part of the coupling structure as monolithically integrated structure within a common semiconductor substrate. In other words, electronic component and at least part of the coupling structure may form a common die. Hence, the at least one through connection may directly contact at least one integrated circuit element of the electronic component to be embedded. Both through connection and circuit element may be surrounded by semiconductor material of the common substrate. Thus, an electronic and mechanical interface between the wiring structure and the integrated circuit elements of the electronic component to be embedded may be formed in semiconductor technology.

In an embodiment, the patterning and the filling are carried out so that the wiring structure is directly electrically connected to the at least one wiring contacting end of the at least one through-connection exposed by the patterning. Hence, a landless or substantially landless connection is possible, rendering the connection procedure simple and the resulting component carrier compact.

In an embodiment, filling the surface recesses formed by the patterning is performed by an electroless deposition of electrically conductive material followed by a galvanic deposition of further electrically conductive material. Therefore, first a metal layer may be deposited, followed by a galvanic deposition of further metallic material to further (in particular fully) fill a recess for forming the wiring structure. This combination of two deposition procedures allows the manufacture of a robust and reliable wiring structure.

In an embodiment, the method comprises polishing at least the exposed surface portion of the coupling structure and the exposed wiring structure after formation of the wiring structure by deposition, in particular by chemical mechanical polishing (CMP). After the previously described two-stage wiring structure formation procedure (in particular by electroless plating and electroplating), it may happen that the exterior surface of the correspondingly processed component carrier is non-planar or uneven and that electrically conductive material is located also at positions at which it is undesired. A chemical-mechanical polishing procedure may ensure that planarity is achieved while having a spatially precisely defined wiring structure.

In an embodiment, the method comprises attaching an electrically conductive mask layer (for instance a copper film) and a photoresist layer on the exterior surface portion of the coupling structure (in particular on an exterior coupling layer thereof). The method may further comprise patterning the photoresist layer and the electrically conductive mask layer to thereby expose part of the exterior surface portion of the coupling structure (in particular such surface portions of the coupling structure at which the wiring structure is to be formed). Then, material of the previously exposed part of the exterior surface portion of the coupling structure can be selectively removed (in particular by a laser treatment or by etching) to thereby expose at least part of the at least one wiring contacting end of the at least one through-connection. Subsequently, the so formed surface recesses may be filled (in particular partially) with electrically conductive material to thereby form the wiring structure in contact with the exposed at least one wiring contacting end. In particular, this formation of the wiring structure may be performed by an electroless deposition procedure followed by a galvanic deposition procedure. The material of the coupling layer may be selected (for instance of palladium doped resin) so that electroless deposition of metallic material will mainly or exclusively occur on the exposed surface of the patterned coupling layer (rather than for instance on the photoresist layer). Advantageously, the metal mask layer may be used for applying an electric voltage during the galvanic deposition procedure.

Still referring to the previously described embodiment, the method may further comprise removing the photoresist layer and the electrically conductive mask layer after the filling. Then, the manufacture of the component carrier may be completed. By such a procedure, the chemical-mechanical polishing procedure described above referring to another embodiment can be omitted, which further simplifies the manufacturing procedure.

Preferably, the component carrier is however configured as a circuit board, in particular as one of the group consisting of a printed circuit board, a substrate, and an interposer. Other types of circuit boards can be implemented as well.

In the context of the present application, a "printed circuit board" (PCB) may denote a board of an electrically insulating core (in particular made of a compound of glass fibers and resin) covered with electrically conductive material and conventionally serving for carrying thereon one or more electronic members (such as packaged electronic chips, sockets, etc.) to be electrically coupled by the electrically conductive material. More specifically, a PCB may mechanically support and electrically connect electronic components using conductive tracks, pads and other features etched from metal structures such as copper sheets laminated onto an electrically non-conductive substrate. PCBs can be single sided (i.e. may have only one of its main surfaces covered by a, in particular patterned, metal layer), double sided (i.e. may have both of its two opposing main surfaces covered by a, in particular patterned, metal layer) or of multi-layer type (i.e. having also one or more, in particular patterned, metal layers in its interior). Conductors on different layers may be connected to one another with plated-through holes which may be denoted as vias. PCBs may also contain one or more electronic components, such as capacitors, resistors or active devices, embedded in the electrically insulating core.

In the context of the present application, an "interposer" may denote an electrical interface device routing between one connection to another. A purpose of an interposer may be to spread a connection to a wider pitch or to reroute a connection to a different connection. One example of an interposer is an electrical interface between an electronic chip (such as an integrated circuit die) and a ball grid array (BGA).

In the context of the present application, a "substrate" may denote a physical body, for instance comprising a ceramic and/or glass material, onto which electronic components are to be mounted.

In an embodiment, the electrically insulating material of the core comprises at least one of the group consisting of resin, in particular Bismaleimide-Triazine resin, glass fibers, prepreg material, polyimide, liquid crystal polymer, epoxy-based Build-Up Film, and FR4 material. The resin material may serve as a matrix material having the desired dielectric properties and being cheap and highly appropriate for mass production. The glass fibers may reinforce the circuit board and may stabilize it mechanically. Furthermore, the glass fibers may introduce an anisotropic property of the respective circuit board, if desired. Prepreg is a suitable material for the circuit board, since it is already a mixture of resin and glass fibers which can be further processed (and particular tempered) for converting it into PCB type dielectric material. FR4 is a flame-resistant dielectric material for PCBs which can be suitably used for the packaging concept according to exemplary embodiments.

The embedded electronic component may particularly denote any active electronic component (such as an electronic chip, in particular a semiconductor chip) or any passive electronic component (such as a capacitor). Examples of the embedded components are a data storage memory such as a DRAM (or any other memory), a microprocessor, a filter (which may for instance be configured as a high pass filter, a low pass filter or a bandpass filter, and which may for instance serve for frequency filtering), an integrated circuit (such as a logic IC), a signal processing component (such as a microprocessor), a power management component, an optical electrically interfacing member (for instance an optoelectronic member), a voltage converter (such as a DC/DC converter or an AC/DC converter), a cryptographic component, a capacitor, an inductance, a switch (for instance a transistor-based switch) and a combination of these and other functional electronic members.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

FIG. 4, FIG. 5, FIG. 6 and FIG. 7 illustrate structures obtained during carrying out a method of manufacturing a component carrier according to an exemplary embodiment of the invention.

DETAILED DESCRIPTION OF EXEMPLARY EMBODIMENTS

Figure 1:
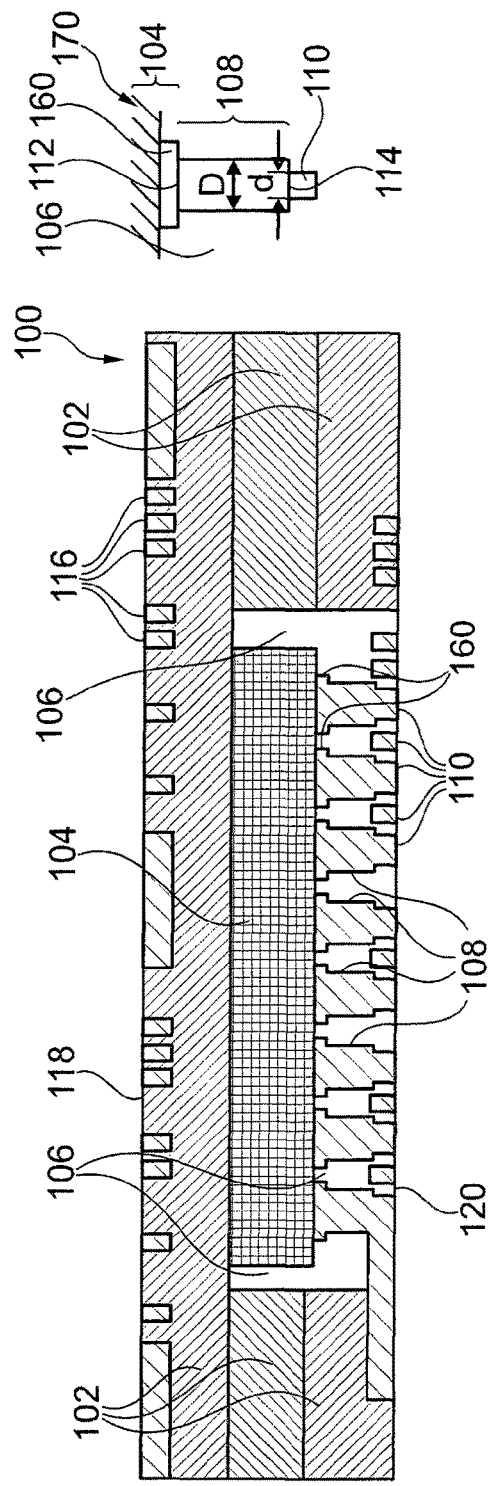
FIG. 1 illustrates a cross-sectional view of a component carrier according to an exemplary embodiment of the invention.

The illustrations in the drawings are schematically presented. In different drawings, similar or identical elements are provided with the same reference signs.

Before exemplary embodiments will be described in further detail referring to the figures, some general considerations of the present inventor will be presented based on which exemplary embodiments have been developed.

According to an exemplary embodiment, an embedded component with ultra-fine line and fine pitch interconnection is provided. Such an embedded component package is particularly appropriate for high voltage applications. Among others, exemplary embodiments of the invention have the following advantages: An interconnect technology to the chip is provided which is simple and efficient. A landless interconnection to the patterning layer on the PCB becomes possible. Exemplary embodiments furthermore provide an ultra-fine line technology with a new grooving and/or plating process. Moreover, exemplary embodiments enable a first level interconnection to the chip, and no redistribution layer (RDL) is needed. Exemplary fields of applications for which exemplary embodiments are particularly applicable are embedded fan out packages, high density embedded modules, and high density substrates (for instance with <8 μm L/S).

FIG. 1 illustrates a cross-sectional view of a component carrier 100 according to an exemplary embodiment of the invention. FIG. 1 in particular shows an embodiment having an interconnection on copper pillars, as through-connections 108, with laser grooved copper filled traces, as wiring structure 110.

More specifically, FIG. 1 shows the plate-shaped component carrier 100 being configured as a printed circuit board (PCB) which is adapted for carrying electronic components (not shown, for instance packaged semiconductor chips) on both of its two opposing main surfaces 118, 120.

The component carrier 100 comprises electrically insulating core 102. In the shown embodiment, the core 102 is formed of three stacked foils. The two lower foils, made of FR4 or prepreg (in particular a combination of resin and glass fibers), are perforated (i.e. are provided with through holes) to delimit an accommodation volume. The upper foil is continuous. The upper foil may either be also made of FR4 or prepreg, or may be made of a material having homogeneous ablation properties such as pure resin (which will allow the formation of wiring structure 116 in an advantageous way).

An electronic component 104, which is here embodied as a semiconductor chip with pads or electric contacts 160, is received in the accommodation volume and therefore embedded in the core 102. The electronic component 104 is therefore buried within an interior of the component carrier 100.

A coupling body 106 of the component carrier 100 comprises a plurality of parallel aligned circular cylindrical copper pillars as electrically conductive through-connections 108 extending vertically (and perpendicular to the main surfaces 118, 120) through surrounding dielectric material of the coupling body 106 in which the through-connections 108 are embedded. Each of the through-connections 108 has two opposing end surfaces constituting a component contacting end 112 and a wiring contacting end 114, respectively. The electric contacts 160 of the embedded electronic component 104 are electrically contacted directly to the component contacting end 112 to thereby form a direct electrically conductive connection between the electronic component 104 and the through-connections 108.

A dielectric exterior surface portion of the coupling body 106 (i.e. the dielectric material, for instance pure resin, of the coupling body 106 at the lower main surface 120) has homogeneous ablation properties and is patterned so as to have surface recesses filled with an electrically conductive wiring structure 110. By the patterning (preferably by laser ablation) of the exposed dielectric material of the coupling structure 106 and the filling of the correspondingly formed recesses, substantially any desired design of the wiring structure 110 may be defined. As can be taken from FIG. 1, the wiring contacting end 114 is electrically contacted directly to the wiring structure 110.

In order to render the ablation properties of the exposed dielectric material of the coupling body 106 homogeneous or constant over the entire dielectric area of the dielectric material of the coupling body 106 at the lower main surface 120 to enable a proper definition of the wiring structure 110, the exterior dielectric surface portion of the coupling body 106 is made of pure resin being free of glass fibres. Alternatively, it is however possible that the exposed dielectric material of the coupling body 106 comprises a matrix and filler particles embedded in the matrix, when the material of the matrix and of the filler particles have homogeneous ablation properties. For instance, such filler particles may comprise small sized glass spheres and/or organic fibres.

Since an exterior surface of the wiring structure 110 flushes with an exterior surface of the coupling body 106 at the lower main surface 120, the latter is flat and therefore not prone to damage during use.

As can be taken from FIG. 1 as well, the component carrier 100 comprises a further electrically conductive wiring structure 116 on the upper main surface 118 of the component carrier 100.

Referring to a detail 170 shown in FIG. 1, a width, d, of traces of the wiring structure 110 is smaller than a diameter, D, of the cylindrical pillars of the through-connections 108.

The component carrier 100 according to FIG. 1 allows to make an ultra-fine line wiring and provides a simple manufacturing procedure for forming the interconnection to embedded electronic components 104 such as dies. Such an ultra-fine line interconnection enables a level 1 interconnection directly to the chip without using a redistribution layer (RDL).

The interconnection of the die is formed with copper pillars instead of copper pads. With this architecture it is possible to bring the ends of the copper pillars close to the surface of the PCB after embedding, for instance by transfer embedding (which may be implemented according to AT 514074, which is hereby incorporated by reference). For transfer embedding according to an exemplary embodiment, it is possible to mount one or multiple coupling structures (for example integrally formed with the electronic component(s) to be embedded) on a dimensionally stable temporary carrier and to attach to the resulting arrangement (for instance by applying a certain pressure, preferably in a vacuum environment) a soft resin coated copper foil (or any other soft adhesive coated electrically conductive wiring structure). The soft adhesive may form a coupling layer of the coupling structure (see reference numeral 202). The coupling structure may have, integrated therein, copper pillars or any other at least one electrically conductive through-connection. But taking this measure, the copper pillars may be directly contacted to the copper foil. After curing, the temporary carrier may then be removed. Subsequently, a printed circuit board like structure may be readily manufactured using prepreg sheets, additional copper structures or the like. By taking the latter measure, the at least one partially electrically insulating core may be manufactured. To make the interconnection to the wiring layer or wiring structure no plated micro vias are needed and therefore the corresponding registration procedure can be eliminated.

For example, the wiring pattern constituting the wiring structure 110 can be formed in the following way: Grooves are formed in a non-glass cloth reinforced dielectric material of the contact structure 106 which is on the surface of the PCB in which the copper pillars of the embedded electronic component 104 are embedded. These grooves can be formed with a laser beam which defines the width and the depth so that the complete pattern may be made with this process. The laser grooves can open the area above the copper pillars and will enable the electrical contact to this in a later plating process.

The registration for this grooving pattern can be done by optical registration to the copper pillars of the die and enable a precise registration of the grooves to the copper pillars. When registration to multiple dies on a panel is needed, an adaptive imaging process may be implemented to adapt the image of every individual die and its offset and skew to the global image of the panel. This process enables that a proper registration of the laser grooves to each die is possible and to make the first level interconnection to the chip.

The finalization of the pattern may be done as follows: Electroless plating of the grooves and the surface of the corresponding (for instance bare epoxide) surface of the PCB is carried out, followed by galvanic plating for filling the grooves. Then, chemical mechanical polishing (CMP) may be performed to remove the plated surface copper.

Before embedding the electronic component 104 in the accommodation volume defined by the core 102, the electronic component 104 is connected to the coupling body 106 consisting of a homogeneous dielectric material in which the through-connections 108 embodied as parallel aligned copper pillars are integrated. For this purpose, a recess can be formed in the coupling body 106 for accommodating the electronic component 104 (which can be connected there by adhering). After this connection procedure for connecting electronic component 104 and coupling body 106 to one another, the latter arrangement is inserted into the accommodation volume of the core 102 and the mentioned constituents may be connected by applying pressure. Subsequently, the lower main surface 120 of the component carrier 100 is made subject of a laser drilling treatment, wherein a trajectory along which a laser beam (not shown) acts on the surface material on the lower main surface 120 of the component carrier 100 defines the shape of the wiring structure 110. In a corresponding way, the upper main surface 118 may be treated for defining wiring structure 116.

Filling the recesses in the exposed surface portion of the coupling body 106, as well as optionally in the exposed surface portion of the core 102 at the lower main surface 120, may then be accomplished by a combination of an electroless metal deposition procedure and a subsequent galvanic deposition procedure. The so filled recesses may still have metallic protrusions extending beyond the coupling body 106 which can be planarized by mechanical-chemical polishing (CMP).

Figure 2:
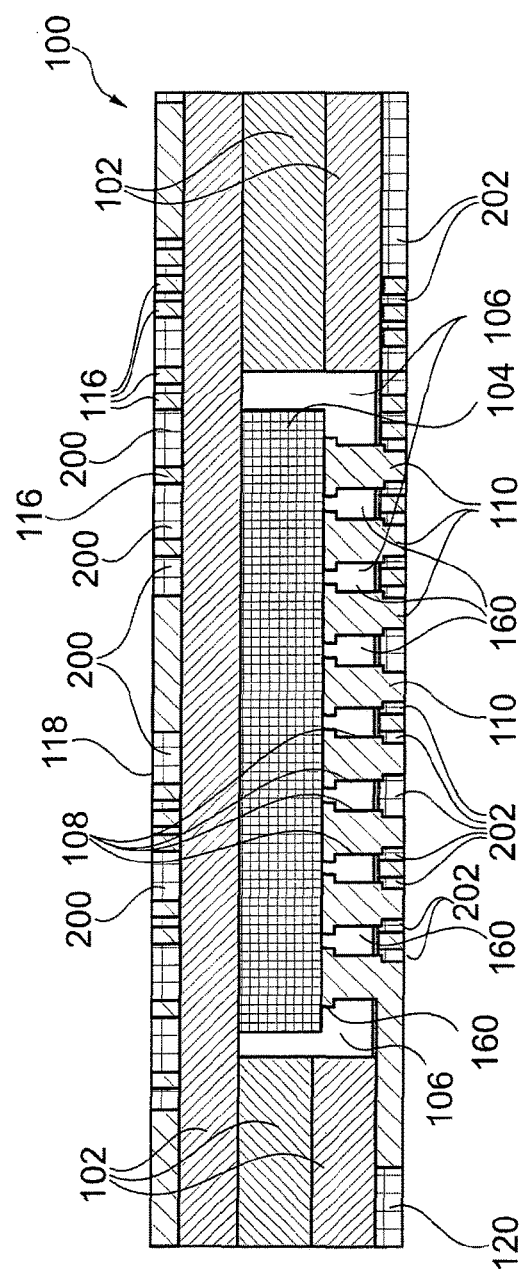
FIG. 2 illustrates a cross-sectional view of a component carrier according to another exemplary embodiment of the invention.

FIG. 2 illustrates a cross-sectional view of a component carrier 100 according to another exemplary embodiment of the invention. FIG. 2 shows a modification of FIG. 1 in which thin copper foils (not shown in FIG. 2) are attached temporarily on the outside of the PCB during the manufacturing procedure (compare FIG. 8 to FIG. 12). Furthermore, palladium (Pd) doped dielectric (see reference numerals 202 and 200) may be used for obtaining a CMP free process.

The modification of the copper patterning process can be done in the following way: Instead of using a non-glass cloth reinforced material as exposed dielectric material of coupling body 106 (see FIG. 1), an additional coupling layer 202 made of a non-class cloth reinforced material with a palladium doped resin is used according to FIG. 2. The coupling body 106 together with the coupling layer 202 form a coupling structure according to FIG. 2. During the manufacturing procedure, on both sides of the PCB a thin copper foil (typically 1 μm to 2 μm thickness) is laminated. This construction enables a process where only laser grooves formed in coupling layer 202 are plated and the CMP process is not needed. Not using a CMP is a benefit because it is a costly process which requires a very flat PCB with thickness tolerances in the micrometer range.

A possible corresponding process flow for manufacturing the component carrier 100 according to FIG. 2 is as the following one:

Photoresist lamination on thin outer layer copper
Imaging with registration on fiducials placed on the core layer
Development of resist
Etching of exposed thin copper foil Removal of exposed resin layer and thickness reduction of photoresist by processes like plasma, RIE or Excimer laser Electroless plating of Pd doped material (only or substantially only this material will be plated)

Electroplating

Stripping of resist and flash etch of thin copper foil

The benefit of such a manufacturing method and the corresponding component carrier 100 shown in FIG. 2 is that with one photo image process a metal mask for the laser ablation process for the Pd doped material is formed and the photoresist protects the metal mask to be exposed during the laser ablation process. Having this construction the surface of the photoresist will be not metallized and only the grooves will be metallized and the thin copper foil which acts as a mask in the laser ablation process enables the electrical interconnection for the galvanic plating process in the grooves.

For this procedure, at least the exterior surface portion of the coupling layer 202 may comprise the mentioned palladium doped resin, or alternatively a copper oxide doped resin. In FIG. 2, not only the exposed surface portion of the coupling layer 202 can comprise a dopant (for instance palladium). In contrast to this, also the exposed layer 200 on the opposing main surface 118 may be made of such a material, so that a corresponding manufacturing method can be applied here as well. Thus, the described manufacturing procedure as well as the corresponding advantages hold for the exposed dielectric surface portions of both opposing main surfaces 118, 120.

Figure 3:
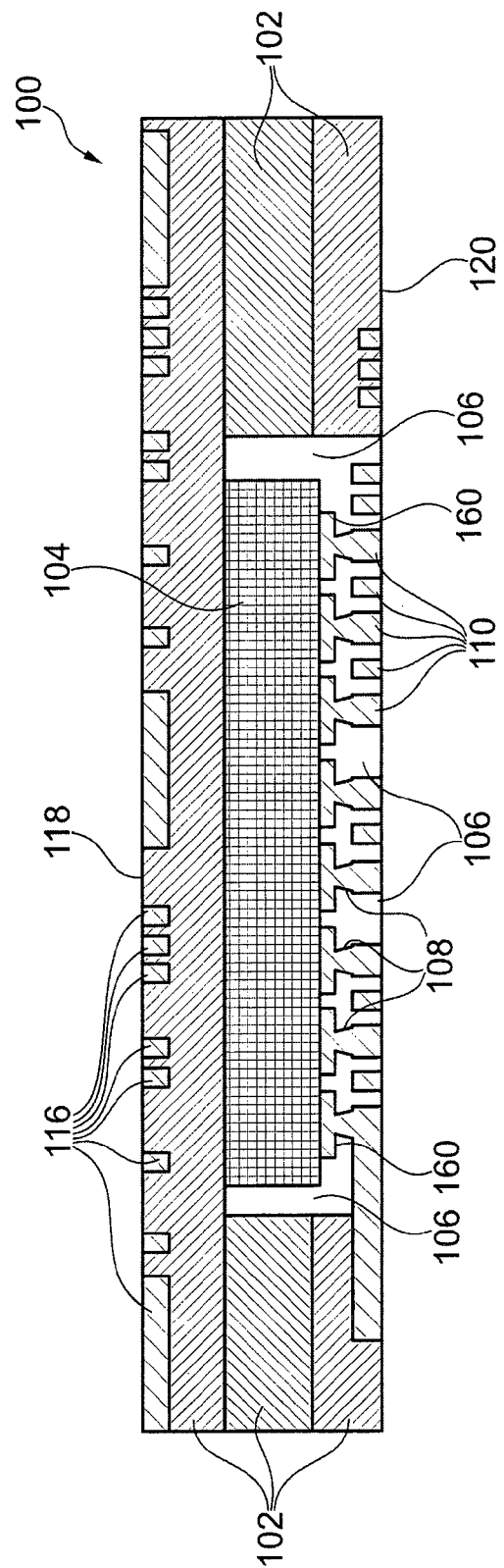
FIG. 3 illustrates a cross-sectional view of a component carrier according to yet another exemplary embodiment of the invention.

FIG. 3 illustrates a cross-sectional view of a component carrier 100 according to yet another exemplary embodiment of the invention. According to FIG. 3, an interconnection with microvias (as through-connections 108) to die (as embedded electronic component 104) made together with the grooves in bare laminate are implemented instead of using copper pillar interconnections (as in FIG. 1). As can be taken from FIG. 3, the copper pillars of FIG. 1 and FIG. 2 can be substituted by vias filled with electrically conductive material.

FIG. 4 to FIG. 7 illustrate structures obtained during carrying out a method of manufacturing a component carrier 100 according to an exemplary embodiment of the invention. With this method, a component carrier 100 corresponding to the one shown in FIG. 1 can be obtained.

FIG. 4 shows an electronic component 104, such is a semiconductor chip with pads or other kind of chip contacts 160, which is to be embedded within a component carrier 100 to be manufactured, making use of a coupling body 106. The prefabricated coupling body 106 comprises a matrix 402 of pure resin (i.e. free of glass fibers) having copper pillars as vertically extending through-connections 108 in an interior of the matrix 402. The through-connections 108 are circular cylindrical copper pillars having exposed component contacting ends 112 at a top thereof and having wiring contacting ends 114 at the bottom thereof, the latter being buried within the matrix 402. As can furthermore be taken from FIG. 4, a layer of a soft, liquid, viscous or flowable adhesive structure 400 is applied on the exposed component contacting ends 112 of the through-connection 108.

While the adhesive structure 400 is still liquid, the electronic component 104 and the coupling body 106 are pressed together (see arrows 404) with the adhesive structure 400 in between so that, since the pads or electric contacts 160 of the electronic component slightly protrude over the rest of the component body, the adhesive material of the adhesive structure 400 flows away at contact positions between the electric contacts 160 and the component contact ends 112 of the through-connections 108. The adhesive structure 400 is then at least partially hardened or cured so as to mechanically connect the electronic component 104 with the coupling body 106. A direct electric contact between the electric contacts 160 and the through-connections 108 is therefore established.

Another method to produce a structure according to FIG. 4 is to plate the copper pillars 400 on the contact pads 160 on the wafer and coat in the next step this side of the wafer with a polymer material (forming part of the coupling structure 106) and cure it. In next step (not shown) the wafer may be diced to the single structures (being dice) shown in FIG. 4.

As can be taken from FIG. 5, the arrangement formed in accordance with FIG. 4 is then inserted into an accommodation volume formed in core 102. The core 102 can be assembled from a plurality of stacked pre-processed prepreg foils or other appropriate material (preferably, at least at and close to opposing main surfaces 118, 120, the material of the core 102 has homogeneous ablation properties, as for instance provided by pure resin, as will be described below in further detail). The insertion procedure is performed in a way that the electronic component 104 is embedded by material of the core 102 and material of the coupling body 106. As indicated by arrows 500, the mentioned constituents of the structure are then connected to one another by applying mechanical pressure, if desired or required accompanied by the supply of thermal energy.

Hence, an accommodation volume is formed within the core 102 for accommodating the electronic component 104, and the core 102 is connected with the electronic component 104 by pressing. The method further comprises embedding the electronic component 104 in the electrically insulating core 102, providing the coupling body 106 with the electrically conductive through-connections 108 extending therethrough and being formed with component contacting end 112 and wiring contacting end 114, and electrically contacting the electronic component 104 directly to the component contacting end 112. The electronic component 104 is connected to the coupling body 106 prior to embedding the electronic component 104 in the core 102. The method further comprises providing soft adhesive structure 400 between the electronic component 104 and the component contact ends 112 at an exposed surface of the coupling body 106, and pressing the electronic component 104 and the coupling body 106 together to thereby squeeze the soft adhesive away from a contact area between the component contact ends 112 and the electric contacts 160 of the electronic component 104.

The so obtained structure, compare FIG. 6, is then made subject of a surface ablation procedure, for instance by laser treatment. By taking this measure, an arrangement of recesses 600 is formed in surface portions of both opposing main surfaces 118, 120 of the so obtained structure. At the lower main surface 120 and in the region where the coupling body 106 is exposed to the environment, the recess structure 600 exposes the wiring contacting ends 114 of the through-connections 108. Highly advantageously, at least the material of the matrix 402 of the coupling body 600 (and preferably also the material of the core 102 exposed to the environment at the two opposing main surfaces 118, 120) is formed of a material with homogeneous ablation properties, for example pure resin (in particular without glass fibers). For designing the recess structure 600 and therefore for designing the subsequently formed wiring structure 110 (see FIG. 7), the laser beam is guided along a freely definable trajectory along a respective one of the main surfaces 118, 120 to selectively ablate material here for defining a desired wiring pattern.

Referring to FIG. 6, the method therefore provides at least an exterior surface portion of the coupling body 106 with homogeneous ablation properties, and patterns the exterior surface portion so as to form surface recesses by laser drilling to constitute the recess structure 600.

In order to obtain the component carrier 100 according to an exemplary embodiment as shown in FIG. 7, the recesses of the recess structure 600 are then filled with electrically conductive material, preferably copper, by first carrying out an electroless deposition procedure, followed by a subsequent galvanic deposition of additional electrically conductive material. This forms wiring structure 110 which directly contacts the through-connections 108 at the wiring contacting ends 114. In order to obtain the planarized component carrier 100 shown in FIG. 7, it is possible to subsequently treat the opposing main surfaces 118, 120 by chemical-mechanical polishing (CMP).

Hence, the method further comprises filling the surface recesses with an electrically conductive wiring structure 110 so that the wiring contacting end 114 is electrically contacted directly to the wiring structure 110. The wiring structure 110 is fully embedded within the surface portion of the coupling body 106 without protruding beyond the surface portion. Filling the surface recesses formed by the patterning can be performed for example by an electroless deposition of electrically conductive material followed by a galvanic deposition of further electrically conductive material (or using another process). The method is completed by polishing the exposed surface portion of the coupling body 106 and the exposed wiring structure 110 by CMP.

FIG. 8 to FIG. 12 illustrate structures obtained during carrying out a method of manufacturing a component carrier 100 according to another exemplary embodiment of the invention. With this method, a component carrier 100 corresponding to the one shown in FIG. 2 can be obtained.

Figure 8:
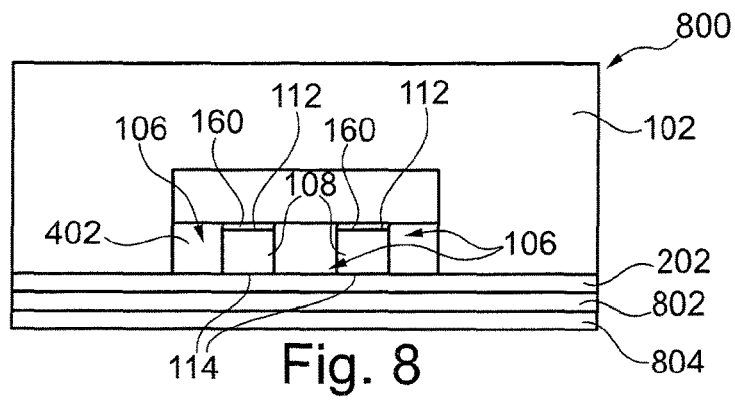
FIG. 8, FIG. 9, FIG. 10, FIG. 11 and FIG. 12 illustrate structures obtained during carrying out a method of manufacturing a component carrier according to another exemplary embodiment of the invention.

In order to obtain structure 800 shown in FIG. 8, a procedure similar to that according to FIG. 5 is applied. However, wiring contacting ends 114 are exposed with regard to the dielectric material of the matrix 402 of the coupling body 106 according to FIG. 8. Alternatively, the wiring contacting ends 114 may also be buried within the dielectric material of the coupling body 106, as in FIG. 5.

Subsequently, a coupling layer 202, which may for instance be made of a palladium doped non-cloth resin, is attached to an exposed lower main surface of the coupling body 106 and of the core 102. Then, a metal mask layer 802 (for instance a copper sheet, which may for instance have a thickness between 1 µm and 2 µm) may be attached on the coupling layer 202. Thereafter, a photoresist layer 804 may be formed (for instance deposited) on the metal mask layer 802. Thus, according to the described method, electrically conductive mask layer 802 and photoresist layer 804 are attached on the exterior surface portion of the coupling layer 202.

Figure 9:
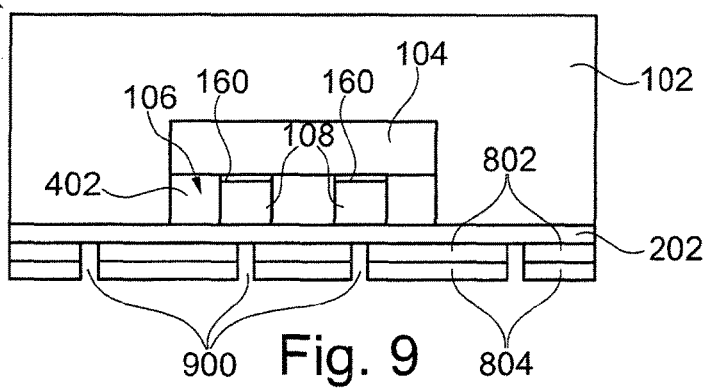

In order to obtain structure 900 shown in FIG. 9, the metal mask layer 802 and the photoresist layer 804 may be patterned to form a plurality of recesses 900 in accordance with a desired wiring structure to be formed. This can be carried out by an appropriate etching procedure to thereby expose certain surface portions of the coupling layer 202. The method hence continues with the patterning of the photoresist layer 804 and the electrically conductive mask layer 802 to thereby expose part of the exterior surface portion of the coupling layer 202.

Figure 10:
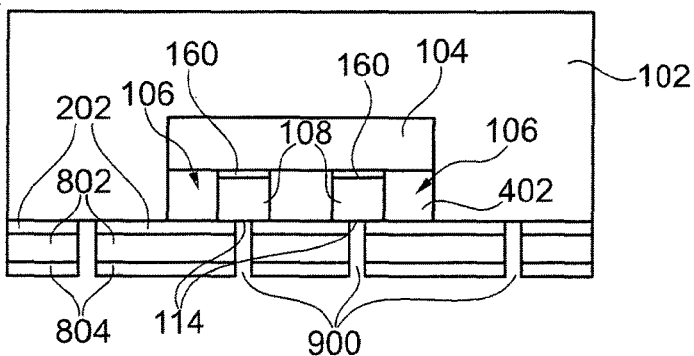

In order to obtain structure 1000 shown in FIG. 10, a further material removal procedure is carried out to further deepen the recesses 900, for instance by reactive ion etching or laser ablation, to thereby thin the photoresist layer 804 and, even more important, to remove exposed surface portions of the coupling layer 202 so as to expose portions of the wiring structure ends 114. In other words, material of the exposed part of the exterior surface portion of the coupling layer 202 is removed to thereby expose parts of the wiring contacting ends 114, preferably by a laser treatment.

Figure 11:
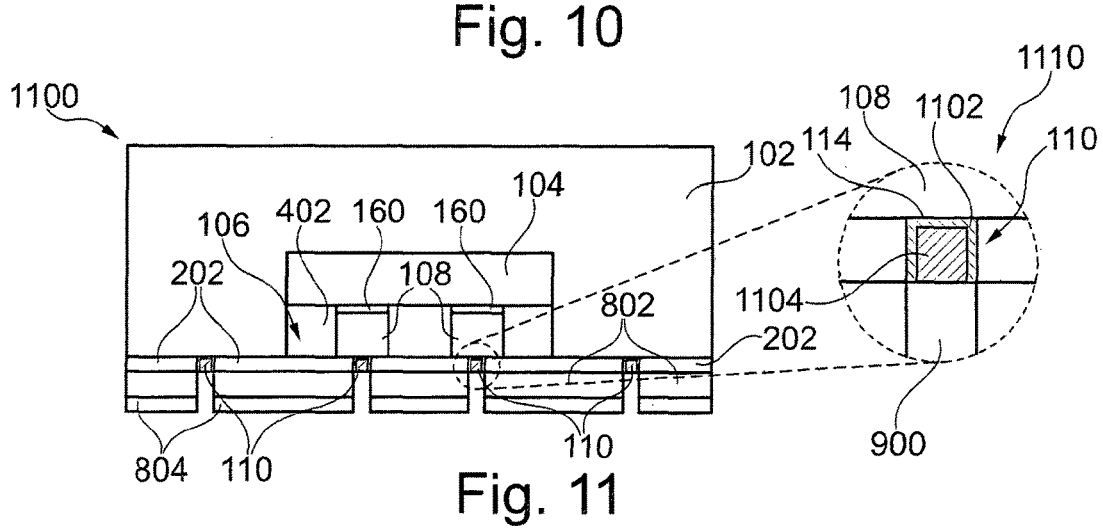

In order to obtain structure 1100 shown in FIG. 11, electrically conductive material such as copper is firstly deposited by electroless plating to thereby form an electroless plating structure 1102 within the recesses 900 selectively on material of the palladium doped resin coupling layer 202 and the wiring structure ends 114 (compare detail 1110). In contrast to this, substantially no electrically conductive material will be deposited on the photoresist layer 804 during the electroless plating procedure. Subsequently, further electrically conductive material such as copper is formed on the electroless plating structure 1102 to thereby form an electro-plating structure 1104, compare detail 1110. During this electroplating procedure an electric voltage may be applied to the electrically conductive metal mask layer 802. Thereby, a wiring structure 110 is formed which is constituted by the electroless plating structure 1102 and the electroplating structure 1104. By the described procedure, the formed recesses in the coupling layer 202 are filled with electrically conductive material to thereby form the wiring structure 110.

Figure 12:
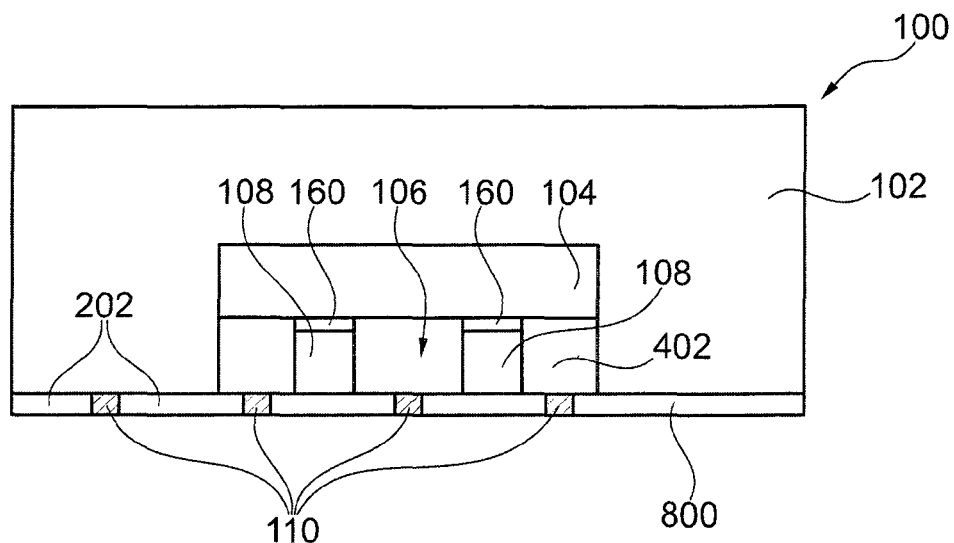

In order to obtain component carrier 100 shown in FIG. 12, the photoresist layer 804 and the metal mask layer 802 are removed. No chemical mechanical polishing is necessary in view of the described formation of the wiring structure 110 which is composed of the electroless plating structure 1102 and the electroplating structure 1104.

Figure 13:
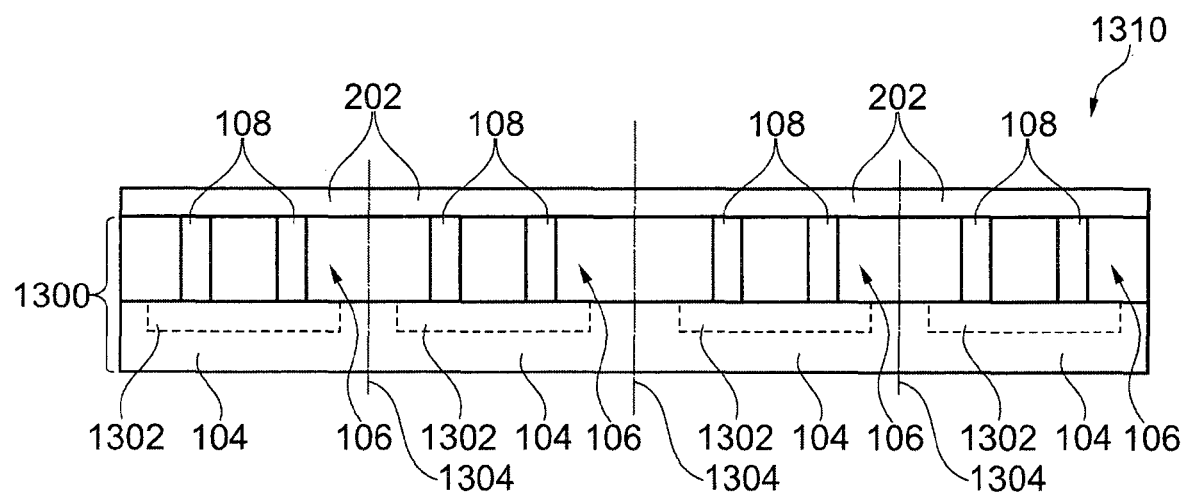
FIG. 13 illustrates a wafer, prior to singularization, comprising a plurality of structures similar to those shown in FIG. 4 obtained by semiconductor processing as monolithically integrated body.

FIG. 13 illustrates a wafer 1310, prior to singularization, comprising a plurality of structures similar to those shown in FIG. 4 obtained by semiconductor processing as monolithically integrated body.

As can be taken from FIG. 13, a common semiconductor substrate 1300, in particular a silicon wafer, comprises a plurality of individual sections which can be singularized by separating (for instance sawing) them along separation lines 1304. Each of these sections comprises a respective one of multiple electronic components 104 and part of a respective one of a plurality of coupling bodies 106 which are integrally formed in common semiconductor substrate 1300. Integrated circuit elements 1302 (such as an array of transistors, etc.) are monolithically integrated within the semiconductor substrate 1300 to thereby form the respective electronic component 104. A plurality of through-connections 108, embodied as copper pillars, extend vertically through surrounding semiconductor material and directly contact integrated circuit elements 1300. A coupling layer 202, for example a polymer layer (or any other material having homogeneous ablation properties), is formed on top of the processed semiconductor wafer 1300 and can be patterned (not shown) for defining the wiring structure 110 (not shown in FIG. 13). After singularization, each of the sections may be used as a basis for forming a component carrier 100 according to exemplary embodiment of the invention, for instance in accordance with any of the procedures shown in FIG. 5 to FIG. 7 or FIG. 8 to FIG. 12.

It should be noted that the term "comprising" does not exclude other elements or steps and the article "a" or "an" does not exclude a plurality. Also elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier for carrying electronic components, wherein the component carrier comprises:
    an at least partially electrically insulating core;
    at least one electronic component embedded in the core;
    a coupling structure with at least one electrically conductive through-connection extending at least partially therethrough and having a component contacting end and a wiring contacting end;
    wherein the at least one electronic component is electrically contacted to the component contacting end;
    wherein at least an exterior surface portion of the coupling structure has homogeneous ablation properties and is patterned so as to have surface recesses filled with an electrically conductive wiring structure;
    wherein the wiring contacting end is electrically contacted directly to the wiring structure;
    wherein the at least one electrically conductive through-connection comprises at least one pillar;
    wherein a lateral extension, d, of traces of the wiring structure is narrower than a lateral extension, D, of the at least one electrically conductive through-connection;
    wherein the electronic component comprises an electric contact, and wherein the component contacting end is connected to the electric contact; and
    wherein a lateral extension of the electric contact is essentially the same or broader than a lateral extension, D, of the at least one electrically conductive through-connection.

2. The component carrier according to claim 1, embodied as one of the group consisting of a circuit board, in particular a printed circuit board, a substrate, and an interposer, wherein in particular the electronic component is selected from a group consisting of an active electronic component and a passive electronic component, in particular one of an electronic chip, a storage device, a filter, a sensor, an actuator, a microelectromechanical system, a microprocessor, a capacitor, a resistor, an inductance, a battery and a logic chip, wherein in particular electrically insulating material of the core comprises at least one of the group consisting of resin, in particular Bismaleimide-Triazine resin, glass fibers, prepreg material, polyimide, liquid crystal polymer, epoxy-based Build-Up Film, and FR4 material.

3. The component carrier according to claim 1, wherein at least the exterior surface portion of the coupling structure is made of a material free of glass fibres.

4. The component carrier according to claim 1, wherein at least the exterior surface portion of the coupling structure comprises at least one of the group consisting of a pure resin, a palladium doped resin, a copper oxide doped resin, and a photoresist, in particular a permanent resist.

5. The component carrier according to claim 1, wherein an exterior surface of the wiring structure is substantially flush with an exterior surface of the exterior surface portion of the coupling structure.

6. The component carrier according to claim 1, comprising at least one of the following features:
    at least one further electrically conductive wiring structure on a main surface of the component carrier opposing another main surface thereof, at which other main surface the exterior surface portion of the coupling structure and the wiring structure are located;
    an adhesive structure covering at least part of an interface between the coupling structure and the at least one electronic component embedded in the core;
    at least one of the wiring structure and the at least one electrically conductive through-connection comprises or consists of at least one of the group consisting of copper, aluminum, and nickel;
    a dielectric material of the coupling structure comprises a matrix and filler particles embedded in the matrix, wherein the material of the matrix and of the filler particles together define the homogeneous ablation properties of the exterior surface portion of the coupling structure;
    wherein the filler particles are selected in particular from a group consisting of beads, in particular glass spheres, and organic fibres;
    the coupling structure comprises or consists of a, in particular prefabricated, separate coupling body;
    the at least one electrically conductive through-connection has a cylindrical shape with an aspect ratio of larger than 1.

7. The component carrier according to claim 1, wherein a lateral extension, D, of the at least one electrically conductive through-connection is essentially the same or broader than a lateral extension of the wiring structure, d.

8. The component carrier according to claim 1, wherein the component carrier comprises at least one of the group consisting of the following features:
    the coupling structure comprises or consists of a combination of a coupling body and a coupling layer being arranged at least partially on the coupling body;
    an electric interface between the at least one electronic component and the at least one electrically conductive through-connection is free of a redistribution layer;
    the at least one electronic component and at least part of the coupling structure are integrally formed, in particular are integrally formed in a semiconductor substrate.

9. The component carrier according to claim 1, wherein the at least one pillar is a circular cylindrical pillar.

10. The component carrier according to claim 1, wherein the at least one pillar comprises a polygonal, in particular rectangular, cross section.

11. The component carrier according to claim 1, wherein the electrically conductive through-connection comprises a plurality of pillars aligned in parallel to one another.

12. The component carrier according to claim 1, wherein the wiring structure is a laser-grooved copper-filled trace.

13. The component carrier according to claim 1, wherein a length of the at least one electrically conductive through-connection is larger than a length of the wiring structure.

14. The component carrier according to claim 1, wherein the component contacting end is directly connected to the electric contact.

15. The component carrier according to claim 1, wherein a length of the at least one electrically conductive through-connection is larger than a length of the electric contact.

16. A method of manufacturing a component carrier for carrying electronic components, comprising:
    embedding at least one electronic component in an at least partially electrically insulating core;
    providing a coupling structure with at least one electrically conductive through-connection extending at least partially therethrough and being formed with a component contacting end and a wiring contacting end, wherein the at least one electrically conductive through-connection comprises at least one pillar;

electrically contacting the at least one electronic component directly to the component contacting end;

providing at least an exterior surface portion of the coupling structure with homogeneous ablation properties;

patterning the exterior surface portion so as to form surface recesses; and filling the surface recesses with an electrically conductive wiring structure so that the wiring contacting end is electrically contacted directly to the wiring structure;

wherein the method comprises at least one of the following features:

connecting the at least one electronic component to at least part of the coupling structure prior to embedding the at least one electronic component in the core;

providing a soft adhesive structure between the at least one electronic component and the at least one component contact end at an exposed surface of the coupling structure;

pressing the at least one electronic component and at least part of the coupling structure together to thereby squeeze the soft adhesive away from a contact area between the component contact end and an electric contact, in particular a protruding electric contact, of the at least one electronic component;

forming the surface recesses by at least one of laser drilling and etching, in particular by at least one of photolithographic etching and reactive ion etching;

forming at least one accommodation volume within the core;

accommodating the at least one electronic component in at least part of the at least one accommodation volume;

connecting the core with the at least one electronic component, in particular by pressing;

fully embedding the wiring structure within the surface portion of the coupling structure without protruding beyond the surface portion;

wherein in particular the patterning and the filling are carried out so that the wiring structure is directly electrically connected to the at least one wiring contacting end of the at least one through-connection exposed by the patterning;

wherein in particular filling the surface recesses formed by the patterning is performed by an electroless deposition of electrically conductive material followed by a galvanic deposition of further electrically conductive material;

wherein the method in particular comprises polishing at least the exposed surface portion of the coupling structure together with the exposed wiring structure, in particular by chemical mechanical polishing;

attaching an electrically conductive mask layer and a photoresist layer on the exterior surface portion of the coupling structure;

patterning the photoresist layer and the electrically conductive mask layer to thereby expose part of the exterior surface portion of the coupling structure;

removing material of the exposed part of the exterior surface portion of the coupling structure to thereby expose at least part of the at least one wiring contacting end, in particular by a laser treatment;

filling the so formed surface recesses with electrically conductive material to thereby form the wiring structure, in particular by an electroless deposition procedure followed by a galvanic deposition procedure;

wherein the method further comprises in particular removing the photoresist layer and the electrically conductive mask layer after the filling;

wherein the method does in particular not comprise polishing an exposed surface after the filling, in particular not by chemical mechanical polishing;

wherein the method comprises in particular providing the at least one electronic component and at least part of the coupling structure as monolithically integrated structure within a common semiconductor substrate.

\* \* \* \* \*